United States Patent
Pai et al.

(10) Patent No.: US 11,561,658 B2
(45) Date of Patent: Jan. 24, 2023

(54) TOUCH SENSOR WITH AUXILIARY CONDUCTIVE UNIT ON TRANSPARENT ELECTRODE

(71) Applicants: Chih-Chiang Pai, Taoyuan (TW); Meng-Kuei Lin, Taoyuan (TW); Hung-Chi Huang, Taoyuan (TW)

(72) Inventors: Chih-Chiang Pai, Taoyuan (TW); Meng-Kuei Lin, Taoyuan (TW); Hung-Chi Huang, Taoyuan (TW)

(73) Assignee: YOUNG FAST OPTOELECTRONICS CO., LTD., Taoyuan (TW)

( * ) Notice: Subject to any disclaimer, the term of this patent is extended or adjusted under 35 U.S.C. 154(b) by 0 days.

(21) Appl. No.: 17/408,418

(22) Filed: Aug. 21, 2021

(65) Prior Publication Data
US 2021/0382581 A1    Dec. 9, 2021

Related U.S. Application Data

(62) Division of application No. 16/705,034, filed on Dec. 5, 2019, now Pat. No. 11,169,645.

(51) Int. Cl.
*G06F 3/044* (2006.01)
*H05K 3/02* (2006.01)
*H05K 3/06* (2006.01)
*G06F 3/046* (2006.01)

(52) U.S. Cl.
CPC ............ *G06F 3/0445* (2019.05); *G06F 3/046* (2013.01); *H05K 3/027* (2013.01); *H05K 3/064* (2013.01); *H05K 3/067* (2013.01); G06F 2203/04106 (2013.01)

(58) Field of Classification Search
CPC ........ H05K 3/064; H05K 3/067; H05K 3/027; G06F 3/046; G06F 3/0445; G06F 2203/04106; G06F 2203/04103
See application file for complete search history.

(56) References Cited

U.S. PATENT DOCUMENTS

2013/0168138 A1 * 7/2013 Yamazaki ............ G06F 3/0443
174/253

* cited by examiner

*Primary Examiner* — Yaron Cohen

(57) ABSTRACT

A touch sensor includes a substrate, a first touch conductive layer (TCL), a first auxiliary conductive layer (ACL), a second touch conductive layer, and a second auxiliary conductive layer. The first TCL has a first touch conductive trail pattern (TCTP). The first ACL has a lower sheet resistance than the first TCL and a first auxiliary conductive trail pattern (ACTP). The second TCL has a second TCTP. The second ACL has a lower sheet resistance than the second touch conductive layer and a second ACTP. The first and second TCTPs and the first and second ACTPs jointly constitute a touch sensor.

8 Claims, 19 Drawing Sheets

TOUCH SENSOR WITH AUXILIARY CONDUCTIVE UNIT ON TRANSPARENT ELECTRODE

CROSS-REFERENCE TO RELATED APPLICATIONS

This application is a division of U.S. patent application Ser. No. 16/705,034, filed Dec. 5, 2019.

TECHNICAL FIELD

The invention relates to touch sensors, particularly to a touch sensor with an auxiliary conductive unit on a transparent electrode.

RELATED ART

Most of currently available touch sensors adopt indium tin oxide (ITO) conductive films as a base material. A touch sensing structure is formed by etching an ITO conductive film to generate touch sensing electrodes and signal wires. Usually, design and manufacture of touch sensors have different requirements to sheet resistance of transparent ITO films depending upon sizes of products. ITO conductive films with different conditions are needed when producing products with different sizes. As a result, to satisfy the requirements of touch panels with various sizes, the pressure on the stockpile cost substantially rises, and the issue of manufacturing complication also occurs. In addition, optical properties of ITO conductive films are approximately inversely proportional to conductivity thereof. In other words, the higher the conductivity (the lower the sheet resistance), the worse the optical properties. For design and manufacture of large-sized touch panels, there is a problem which is hard to be solved.

SUMMARY OF THE INVENTION

An object of the invention is to provide a touch sensor with an auxiliary conductive unit on a transparent electrode, which can reduce sheet resistance of the touch sensing electrodes and signal wires without impairing optical properties.

To accomplish the above object, the touch sensor of the invention includes:

a substrate, having a dielectric property and transmittance, defined with an operative touch area in a central portion of the substrate and an inoperative touch area surrounding the operative touch area;

a first touch conductive layer, being a transparent conductive film, disposed on a first side of the substrate, having a first touch conductive trail pattern with first touch sensing electrodes and first signal wires, wherein the first touch sensing electrodes are arranged in the operative touch area and along a first direction in series, at least one end of each of the first touch sensing electrodes connects with one of the first signal wires, and the first signal wires are arranged in the inoperative touch area;

a first auxiliary conductive layer, being an opaque conductive film, electrically attached on the first touch conductive layer, having a lower sheet resistance than the first touch conductive layer, having a first auxiliary conductive trail pattern formed in an area range defined by the first touch conductive trail pattern, wherein the first auxiliary conductive trail pattern comprises first micro auxiliary conductive units and first auxiliary signal wires, the first micro auxiliary conductive units are overlappingly disposed in an area range of the first touch sensing electrodes, and the first auxiliary signal wires are overlappingly formed in at least part of an area range of the first signal wires;

a second touch conductive layer, being a transparent conductive film, disposed on a second side of the substrate, having a second touch conductive trail pattern with second touch sensing electrodes and second signal wires, wherein the second touch sensing electrodes are arranged in the operative touch area and along a second direction in series, at least one end of each of the second touch sensing electrodes connects with one of the second signal wires, the second signal wires are arranged in the inoperative touch area, and the first direction is orthogonal to the second direction; and a second auxiliary conductive layer, being an opaque conductive film, electrically attached on the second touch conductive layer, having a lower sheet resistance than the second touch conductive layer, having a second auxiliary conductive trail pattern formed in an area range defined by the second touch conductive trail pattern, wherein the second auxiliary conductive trail pattern comprises second micro auxiliary conductive units and second auxiliary signal wires, the second micro auxiliary conductive units are overlappingly disposed in an area range of the second touch sensing electrodes, and the second auxiliary signal wires are overlappingly formed in at least part of an area range of the second signal wires, and the first touch conductive trail pattern, the first auxiliary conductive trail pattern, the second touch conductive trail pattern and the second auxiliary conductive trail pattern jointly constitute a touch sensor.

By the touch sensor of the invention, the first touch conductive trail pattern, the first auxiliary conductive trail pattern, the second touch conductive trail pattern and the second auxiliary conductive trail pattern jointly constitute at least one touch sensor. The first auxiliary conductive trail pattern is used for reducing sheet resistance of the first touch conductive trail pattern, the second auxiliary conductive trail pattern is used for reducing sheet resistance of the second touch conductive trail pattern.

DETAILED DESCRIPTION OF THE INVENTION

The First Embodiment

The first embodiment of the manufacturing method of the invention is depicted in FIGS. 2-10, and its steps are described below.

Figure 1:
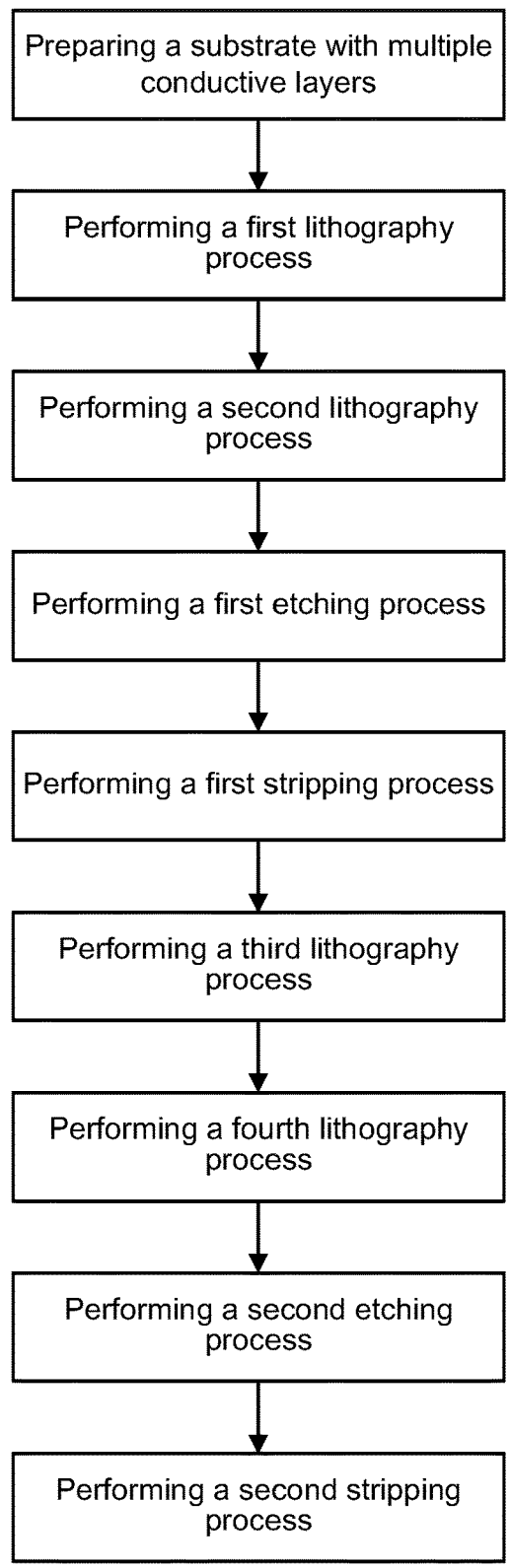
FIG. 1 is a flowchart of the manufacturing method of the invention.
Figure 2:
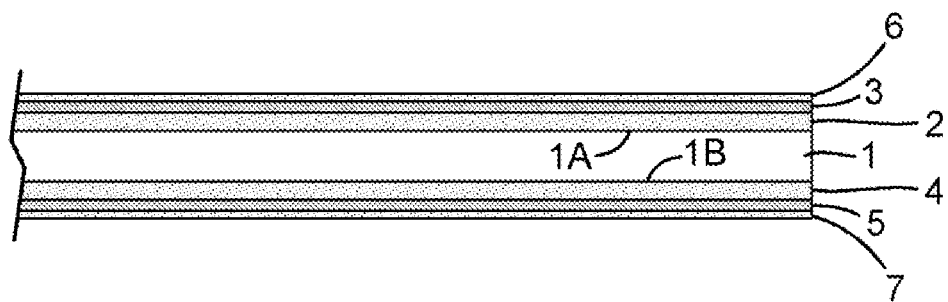
FIG. 2 is a cross-section view showing forming two conductive layers and a photoresist layer on each side of a substrate of the first embodiment of the invention.

Please refer to FIG. 2. First, prepare a dielectric substrate 1 with high transmittance. A first touch conductive layer 2 and a first auxiliary conductive layer 3 are superposed on a first side 1A of the dielectric substrate 1 in order. A second touch conductive layer 4 and a second auxiliary conductive layer 5 on a second side 1B of the dielectric substrate 1 in order. The first side 1A and the second side 1B are two opposite sides of the dielectric substrate 1.

The substrate 1 is made of glass, polycarbonate (PC), polyester (PET), polymethyl methacrylate (PMMA), or cycloolefin copolymer (COC), but not limited to these, any other flexible, rigid or soft transparent materials are also available.

Both the first touch conductive layer 2 and the second touch conductive layer 4 are two transparent conductive films made of an identical material, which may be, but not limited to, a metal oxide such as indium tin oxide, indium zinc oxide, zinc aluminum oxide, tin antimony oxide or polyethylene dioxythiophenethe or graphene. Preferably, a sheet resistance of each of the first touch conductive layer 2 and the second touch conductive layer 4 is between 80 and 150 ohm/sq.

Both the first auxiliary conductive layer 3 and the second auxiliary conductive layer 5 are two opaque conductive films made of an identical material, which may be, but not limited to, gold, silver, copper, aluminum, molybdenum, nickel or an alloy thereof. Preferably, sheet resistance of each of the first auxiliary conductive layer and the second auxiliary conductive layer is between 0.05 and 0.2 ohm/sq. As abovementioned, the first auxiliary conductive layer 3 is less than the first touch conductive layer 2 in sheet resistance, and the first auxiliary conductive layer 3 is electrically superposed on the first touch conductive layer 2. Identically, the second auxiliary conductive layer 5 is less than the second touch conductive layer 4 in sheet resistance, and the second auxiliary conductive layer 5 is electrically superposed on the second touch conductive layer 4.

In this embodiment, each of the first touch conductive layer 2 and the second touch conductive layer 4 adopts an indium tin oxide (ITO) film which has been widely applied in touch panels, and each of the first auxiliary conductive layer 3 and the second auxiliary conductive layer 5 adopts a copper (Cu) film which possesses low impedance (great conductivity) and cheap price.

Figure 3:
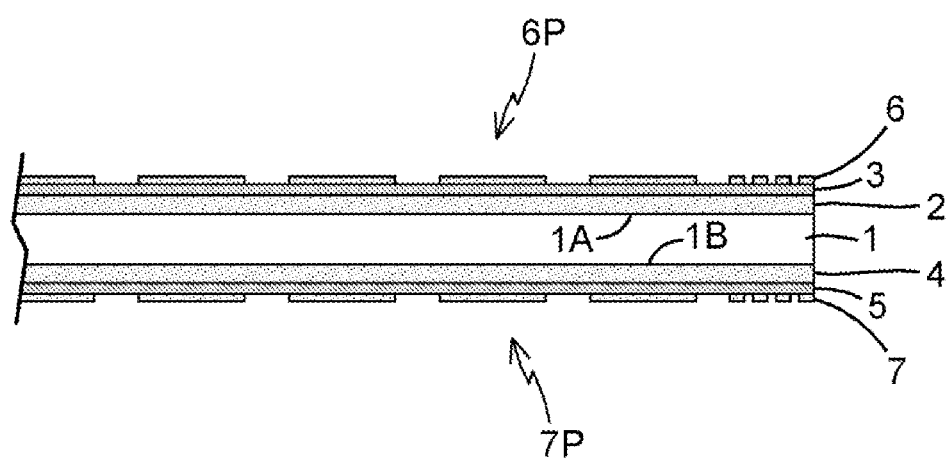
FIG. 3 is a cross-section view of the substrate after performing the first and second lithography processes of the first embodiment of the invention.

As shown in FIGS. 2 and 3, perform a first lithography process to the first side 1A of the substrate 1. The first lithography process includes the following steps: (1) forming a photoresist layer: forming a first photoresist layer 6 on the first side 1A of the substrate 1 (i.e. the outer surface of the outermost first auxiliary conductive layer 3) by coating; (2) baking the photoresist layer: baking the substrate, proving hot wind with about 60° C.~90° C. to bake the first photoresist layer 6 on the substrate 1 for about 100~140 seconds, and then slowly cooling down to a normal temperature; (3) exposing the photoresist layer: exposing the first photoresist layer 6, providing an ultraviolet light source with irradiation energy about 150~250 MJ/cm$^2$, disposing a photomask (not shown) with a preset conductive trail pattern between the first photoresist layer 6 and the a light source, exposing the first photoresist layer 6 with keeping a gap about 30 μm~80 μm with the first photoresist layer 6 to transfer the preset conductive trail pattern on the photomask onto the first photoresist layer 6; and (4) development of the photoresist layer: developing the first photoresist layer 6, spraying a developer to the first photoresist layer 6 with spraying pressure about 0.5 Kg/cm$^{2'}$ and then spraying a detergent to the first photoresist layer 6 with spraying pressure about 0.5 Kg/cm2 to remove unwanted photoresist material.

A first photoresist trail pattern 6P can be developed to be formed on the first photoresist layer 6 by the first lithography process.

In addition, a second lithography process is performed on the second side 1B of the substrate 1. The means for implementing the second lithography process is identical to the first lithography process, so the details thereof will not be repeated here. As a result, a second photoresist trail pattern 7P can be developed to be formed on the second photoresist layer 7 on the second side 1B.

In the first and second lithography processes, the first photoresist layer 6 is coated on the first auxiliary conductive layer 3 and the second photoresist layer 7 is coated on the second auxiliary conductive layer 5. In other words, the first and second auxiliary conductive layers 3, 5 are sandwiched between the first photoresist layer 6 and the second photoresist layer 7. Because the first and second auxiliary conductive layers 3, 5 are opaque conductive films (copper films), the operations of exposure and development of the first and second photoresist layers 6, 7 do not interfere with each other. This can increase processing efficiency.

Figure 4:
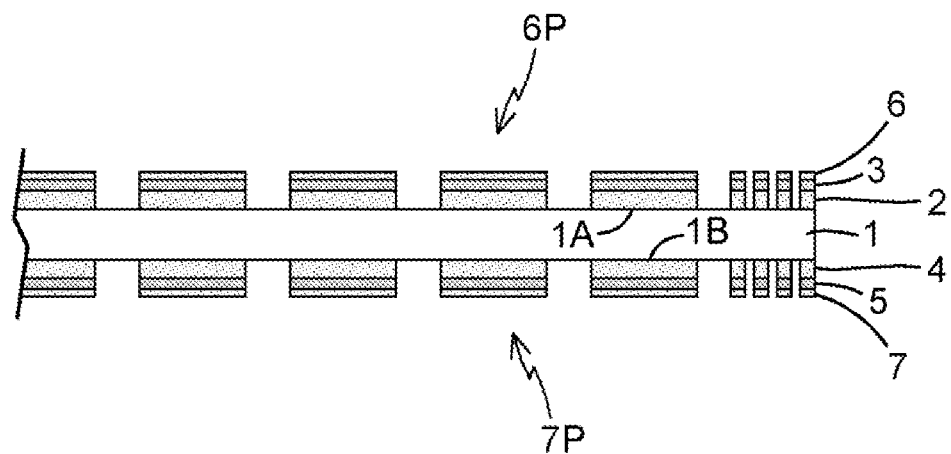
FIG. 4 is a cross-section view of the substrate after performing the first etching process of the first embodiment of the invention.

Please refer to FIG. 4. Next, simultaneously perform a first etching process to the first and second sides 1A, 1B of the substrate 1. Etch the various conductive layers on the substrate 1 by using a first etchant to remove portions of material, which are not protected by both the first photoresist layer 6 and the second photoresist layer 7. In this embodiment, wet etching is adopted as an example. Its implementing manner is: place the substrate 1 in an etching tank, spray the first etchant onto the first and second sides 1A, 1B of the substrate 1 with spraying pressure about 0.6 Kg/cm$^2$, remove portions of material on the first touch conductive layer 2 and the first auxiliary conductive layer 3 on the first side 1A, which are not protected by the first photoresist layer 6, and remove portions of material on the second touch conductive layer 4 and the second auxiliary conductive layer 5 on the second side 1B, which are not protected by the second photoresist layer 7. After the etching has been finished, spray washing/neutralizing liquid (such as pure water) with spraying pressure about 1.5 Kg/cm$^2$ onto both sides of the substrate 1 to wash.

The first etchant is a complex etchant which can etch both the ITO material of both the first touch conductive layer 2 and the second touch conductive layer 4 and the copper material of both the first auxiliary conductive layer 3 and the second auxiliary conductive layer 5. In this embodiment, the first etchant at least contains iron nitrate $Fe(NO_3)_3$ and hydrochloric acid (HCl).

Next, perform a first stripping process to remove the first and second photoresist layers 6, 7 on the substrate 1. Its means is to spray a stripping agent (for example, potassium hydroxide (KOH)) with spraying pressure about 0.6 Kg/cm$^2$ onto the first and second photoresist layers 6, 7 to make them stripped from the surfaces of the conductive layers and then spray a detergent (for example, water) with spraying pressure about 1.5 Kg/cm$^2$ onto both sides of the substrate 1.

Figure 5:
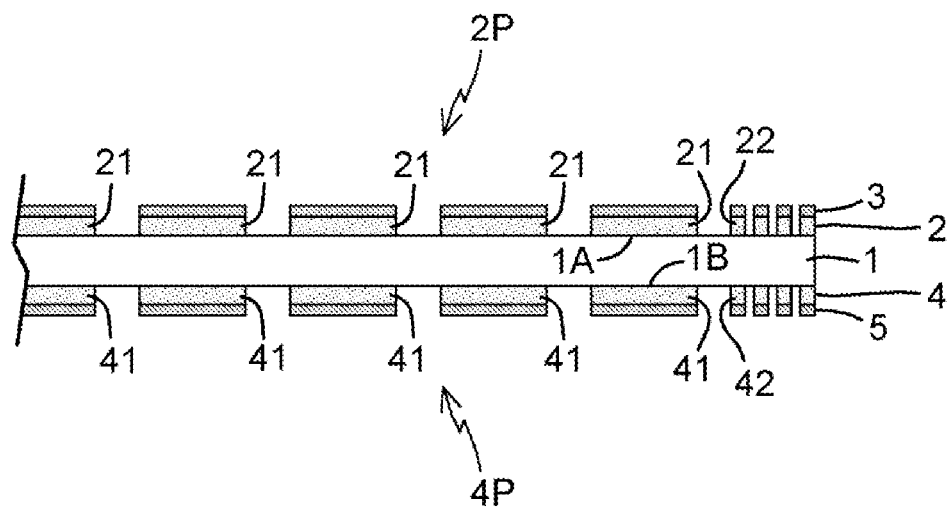
FIG. 5 is a cross-section view of the substrate after performing the first stripping process of the first embodiment of the invention.

As shown in FIG. 5, when the first stripping process has been finished, a first touch conductive trail pattern 2P (please refer to FIG. 12) corresponding to the first photoresist trail pattern 6P is formed by etching both the first touch conductive layer 2 and the first auxiliary conductive layer 3 on the first side 1A. The first touch conductive trail pattern 2P at least includes a pattern portion of a first touch sensing electrode 21 and a pattern portion of a first signal wire 22.

In this embodiment, the first touch sensing electrodes 21 are arranged along a first direction (i.e. X-axis direction) and connected in series, and each of the first signal wires 22 electrically connects with one of the first touch sensing electrodes 21. In addition, a second touch conductive trail pattern 4P corresponding to the second photoresist trail pattern 7P is formed by etching both the second touch conductive layer 4 and the second auxiliary conductive layer 5 on the second side 1B. The second touch conductive trail pattern 4P at least includes a pattern portion of a second touch sensing electrode 41 and a pattern portion of a second signal wire 42. In this embodiment, the second touch sensing electrodes 41 are arranged along a second direction (i.e. Y-axis direction) and connected in series, and each of the second signal wires 42 electrically connects with one of the second touch sensing electrodes 41.

Figure 6:
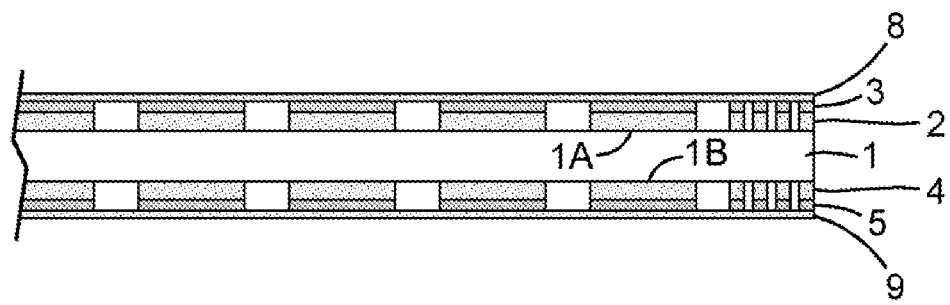
FIG. 6 is a cross-section view of the substrate after forming a photoresist layer on each side of the substrate of the first embodiment of the invention.
Figure 7:
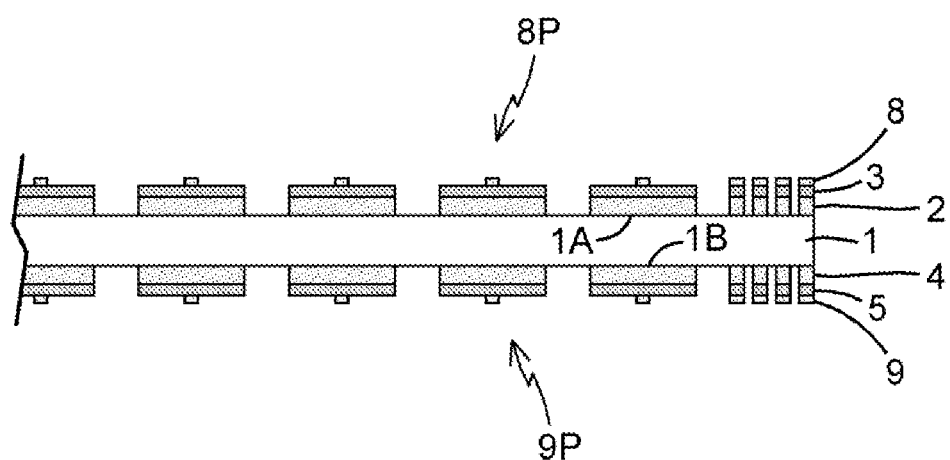
FIG. 7 is a cross-section view of the substrate after performing the third and fourth lithography processes of the first embodiment of the invention.

Please refer to FIGS. 6-7. Next, a third lithography process is performed on the first side 1A of the substrate 1. The means for implementing the third lithography process is identical to the first lithography process, so the details thereof will not be repeated here. As a result, a third photoresist trail pattern 8P can be developed to be formed on the third photoresist layer 8 on the first side 1A. In addition, a fourth lithography process is performed on the second side 1B of the substrate 1. The means for implementing the fourth lithography process is identical to the first lithography process, so the details thereof will not be repeated here. As a result, a fourth photoresist trail pattern 9P can be developed to be formed on the fourth photoresist layer 9 on the second side 1B.

In the third and fourth lithography processes, the third photoresist trail pattern 8P is located in an area range of the first touch conductive trail pattern 2P of the first auxiliary conductive layer 3, and the fourth photoresist trail pattern 9P is located in an area range of the second touch conductive trail pattern 4P of the second auxiliary conductive layer 5. Because the first and second auxiliary conductive layers 3, 5 are opaque conductive films (copper films), the operations of exposure and development of the third and fourth photoresist layers 8, 9 do not interfere with each other when the third and fourth lithography processes are simultaneously or separately implemented to both sides 1A, 1B of the substrate 1.

Figure 8:
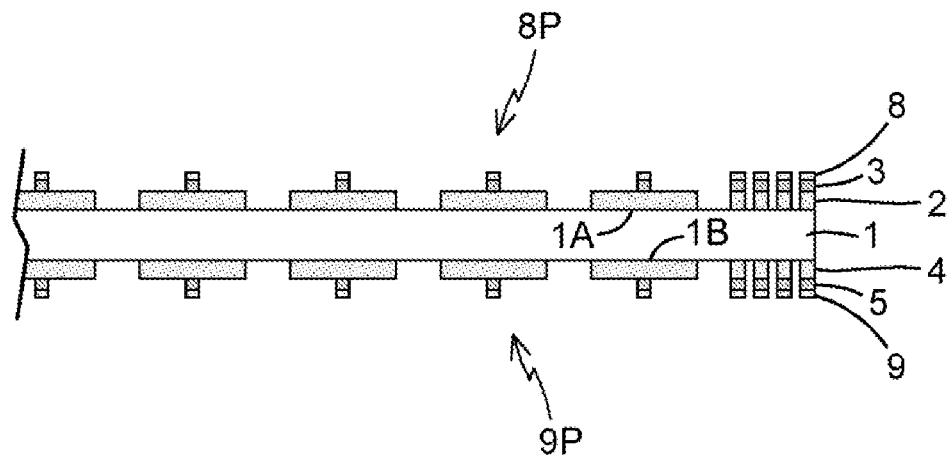
FIG. 8 is a cross-section view of the substrate after performing the second etching process of the first embodiment of the invention.

Please refer to FIG. 8. Next, simultaneously perform a second etching process to the first and second sides 1A, 1B of the substrate 1. Etch the first and the second auxiliary conductive layers 3, 5 on the substrate 1 by using a second etchant to remove portions of material, which are not protected by both the third photoresist layer 8 and the fourth photoresist layer 9. The second etchant does not etch the ITO material of both the first touch conductive layer 2 and the second touch conductive layer 4. In this embodiment, the second etchant at least contains iron nitrate $Fe(NO_3)_3$. The means for implementing the second etching process is identical to the first etching process, so the details thereof will not be repeated here.

Finally, perform a second stripping process to remove the third and fourth photoresist layers 8, 9 on the substrate 1. The means for implementing the second stripping process is identical to the first stripping process, so the details thereof will not be repeated here.

Figure 9:
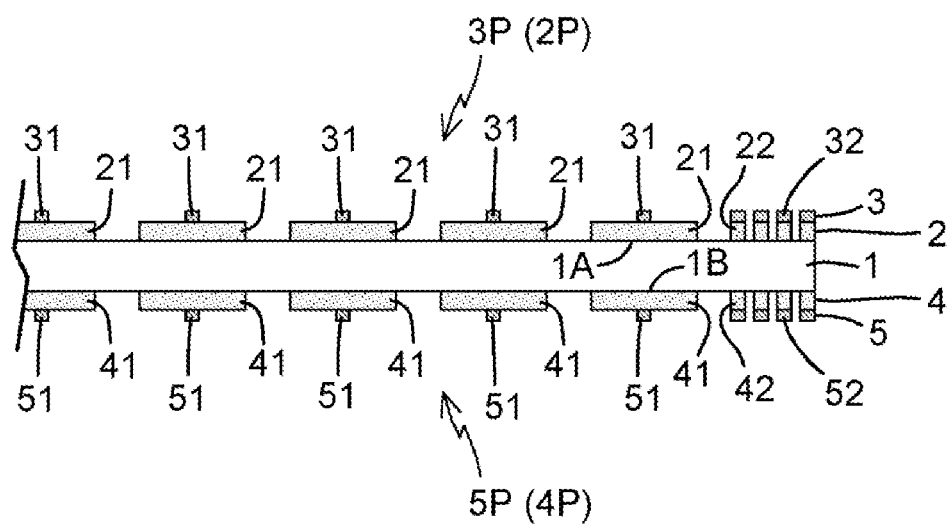
FIG. 9 is a cross-section view of the product of the substrate of the first embodiment of the invention.
Figure 10:
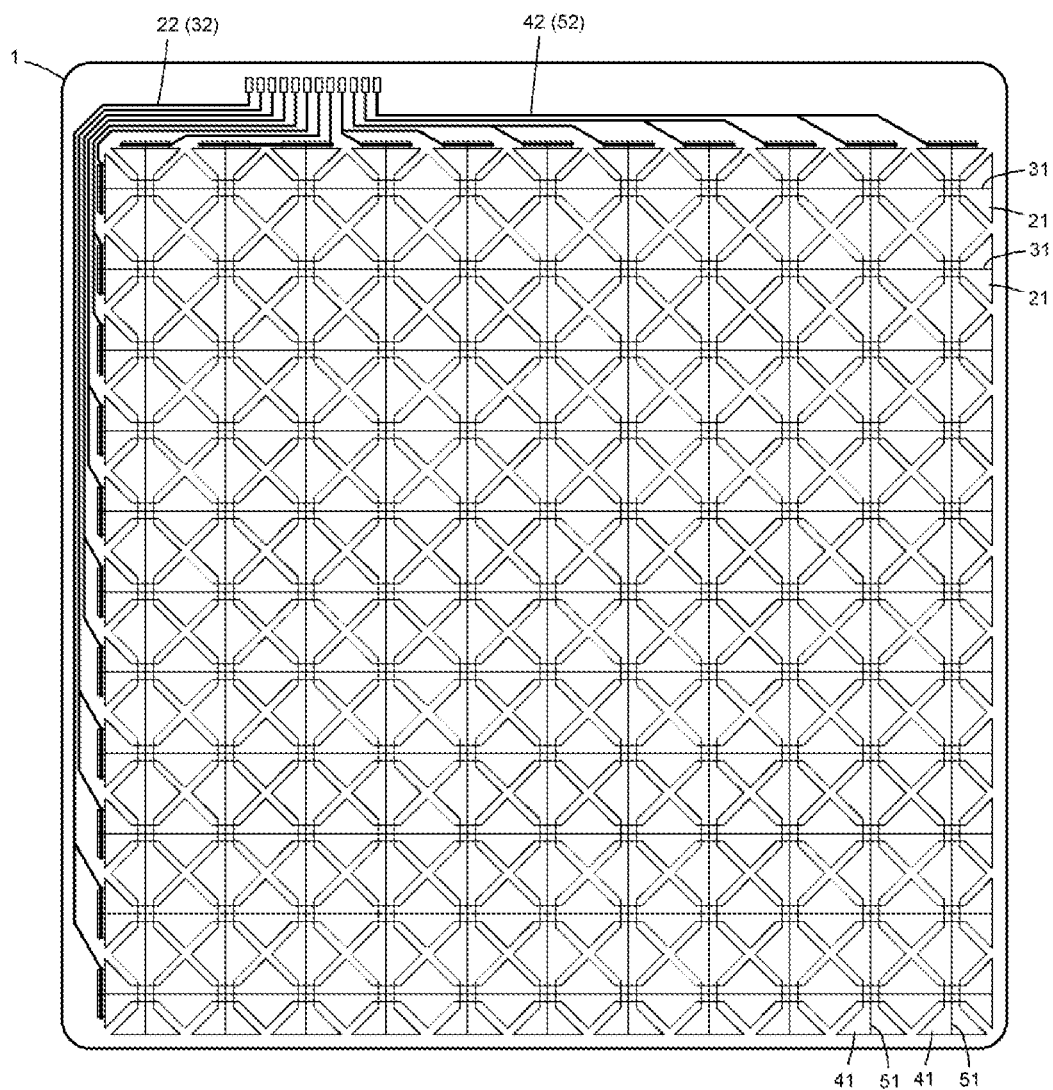
FIG. 10 is a plan view of the product of the substrate of the first embodiment of the invention.

As shown in FIGS. 9 and 10, when the second stripping process has been finished, a first auxiliary conductive trail pattern 3P (please refer to FIG. 13) corresponding to the third photoresist trail pattern 8P is formed by etching the first auxiliary conductive layer 3 on the first side 1A. And the first touch conductive trail pattern 2P formed by the first etching process is still kept on the first touch conductive layer 2. The first auxiliary conductive trail pattern 3P at least includes a pattern portion of a first micro auxiliary conductive unit 31 and a pattern portion of a first auxiliary signal wire 32. Particularly, the first micro auxiliary conductive unit 31 is arranged in an area range of the first touch sensing electrode 21, and a shading rate of the first micro auxiliary conductive unit 21 is below 1%. At least part of the first auxiliary signal wire 32 is overlappingly formed in an area range of the first signal wire 22.

In addition, a second auxiliary conductive trail pattern 5P corresponding to the fourth photoresist trail pattern 9P is formed by etching the second auxiliary conductive layer 5 on the second side 1B. And the second touch conductive trail pattern 4P formed by the first etching process is still kept on the second touch conductive layer 4. The second auxiliary conductive trail pattern 5P at least includes a pattern portion of a second micro auxiliary conductive unit 51 and a pattern portion of a second auxiliary signal wire 52. Particularly, the second micro auxiliary conductive unit 51 is arranged in an area range of the second touch sensing electrode 41, and a shading rate of the second micro auxiliary conductive unit 51 is below 1%. At least part of the second auxiliary signal wire 52 is overlappingly formed in an area range of the second signal wire 42. In this embodiment, the first touch conductive trail pattern 2P, the first auxiliary conductive trail pattern 3P, the second touch conductive trail pattern 4P and the second auxiliary conductive trail pattern 5P jointly constitute a capacitive touch sensor.

According to the above description, the invention can reduce sheet resistance by means of disposing auxiliary conductive trail patterns 3P, 5P on the touch conductive trail patterns 2P, 4P. In a visible area (approximately identical to an operative touch area) of the touch sensor, the micro auxiliary conductive units 31, 51 disposed on the touch sensing electrodes 21, 41 are formed by opaque films, but they possess a very low shading rate (below 1%), so the influence upon the visibility of the touch sensing electrodes 21, 41 is minimal or even negligible.

FIGS. 9-18 show a touch sensor made by the first embodiment of the manufacturing method of the invention. Its primary features are micro auxiliary conductive units with high conductivity on touch sensing electrodes and auxiliary conductive wires with high conductivity electrically connected with signal wires. Thereby, sheet resistance of the touch sensing electrodes and conductive wires can be reduced. As a result, the touch sensor has required impedance without decreasing optical properties.

The following embodiment is a capacitive touch sensor as an example. The touch sensor includes a substrate 1, a first touch conductive layer 2, a first auxiliary conductive layer 4, a second touch conductive layer 3 and a second auxiliary conductive layer 5. Two opposite sides of the substrate 1 are separately disposed with a first touch conductive trail pattern 2P and a second touch conductive trail pattern 4P. The first touch conductive trail pattern 2P is electrically connected with a first auxiliary trail pattern 3P. The second touch conductive trail pattern 4P is electrically connected with a second auxiliary trail pattern 5P.

The substrate 1 is a plate with a dielectric property and high transmittance and is made of glass, polycarbonate (PC), polyester (PET), polymethyl methacrylate (PMMA), or cycloolefin copolymer (COC), but not limited to these, any other flexible, rigid or soft transparent materials are also available.

Both the first touch conductive layer 2 and the second touch conductive layer 4 are two transparent conductive films made of an identical material, which may be, but not limited to, a metal oxide such as indium tin oxide, indium zinc oxide, zinc aluminum oxide, tin antimony oxide or polyethylene dioxythiophenethe or graphene. Preferably, a sheet resistance of each of the first touch conductive layer 2 and the second touch conductive layer 4 is between 80 and 150 ohm/sq. Both the first auxiliary conductive layer 3 and the second auxiliary conductive layer 5 are two opaque conductive films made of an identical material, which may be, but not limited to, gold, silver, copper, aluminum, molybdenum, nickel or an alloy thereof. Preferably, sheet resistance of each of the first auxiliary conductive layer and the second auxiliary conductive layer is between 0.05 and 0.2 ohm/sq. According to the abovementioned, the first auxiliary conductive layer 3 is less than the first touch conductive layer 2 in sheet resistance. Identically, the second auxiliary conductive layer 5 is less than the second touch conductive layer 4 in sheet resistance. In this embodiment, the substrate 1 adopts glass material, and each of the first touch conductive layer 2 and the second touch conductive layer 4 adopts an indium tin oxide (ITO) film which has been widely applied in touch panels, and each of the first auxiliary conductive layer 3 and the second auxiliary conductive layer 5 adopts a copper (Cu) film which possesses low impedance (great conductivity) and cheap price.

The substrate 1 is defined with an operative touch area in a central portion of the substrate 1 and an inoperative touch area surrounding the operative touch area.

Figure 11:
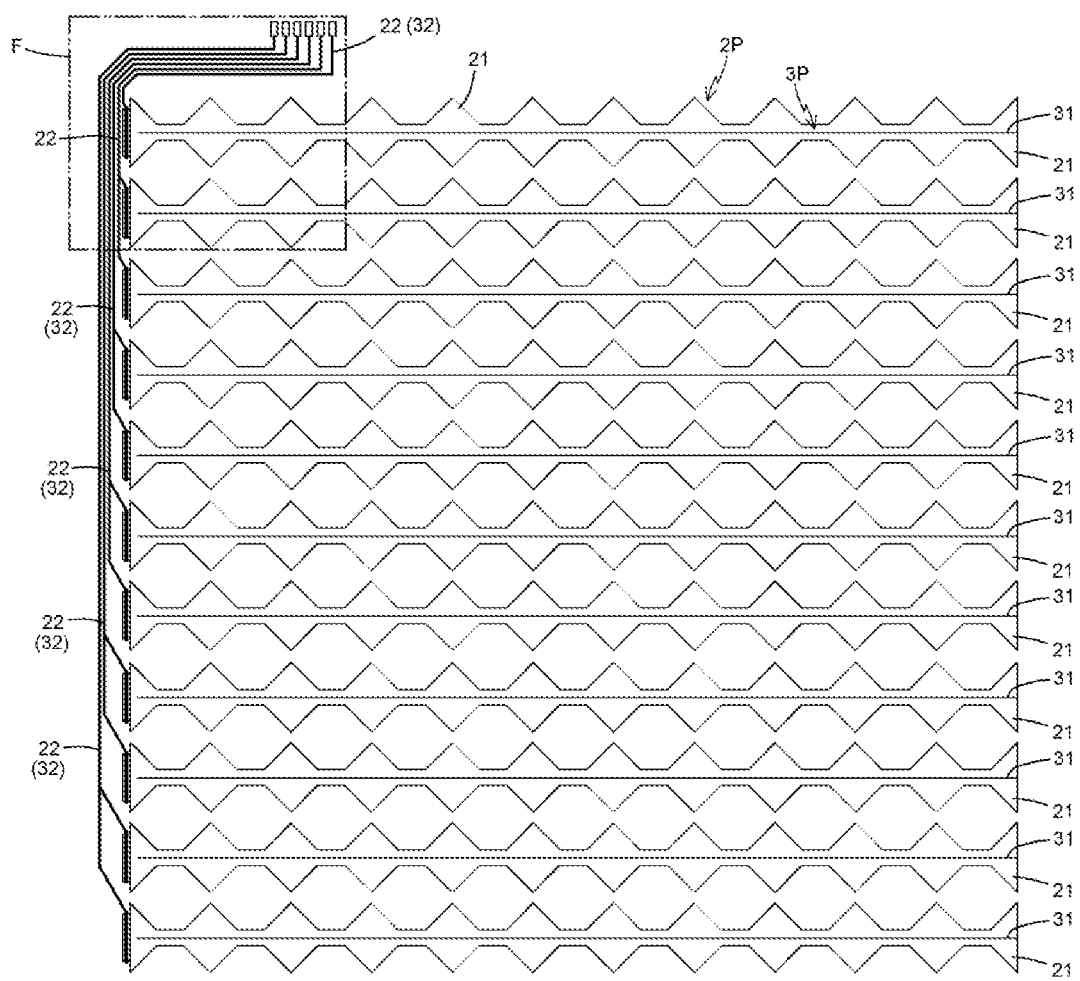
FIG. 11 is a plan view of the X-axis touch sensing trail on the first side of the product of the substrate of the first embodiment of the invention.
Figure 12:
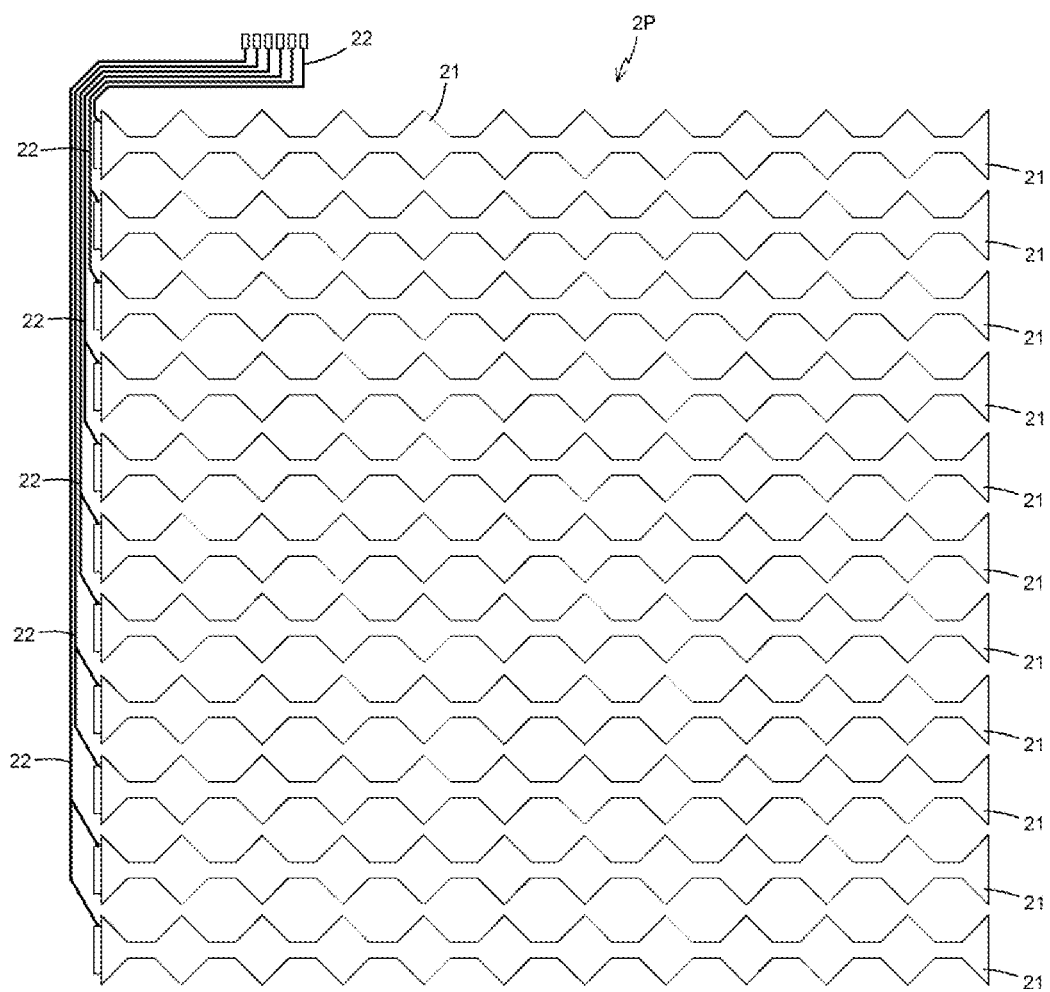
FIG. 12 is a plan view of the first touch conductive trial pattern of the product of the first embodiment of the invention.

As shown in FIGS. 11 and 12, the first touch conductive layer 2 is disposed on a first side 1A of the substrate 1 and has the first touch conductive trail pattern 2P with first touch sensing electrodes 21 and first signal wires 22. The first touch sensing electrodes 21 are diamonds arranged in the operative touch area and along a first direction (i.e. X-axis direction) and connected in series. At least one end of each of the first touch sensing electrodes 21 connects with one of the first signal wires 22. The first signal wires 22 are arranged in the inoperative touch area.

Figure 13:
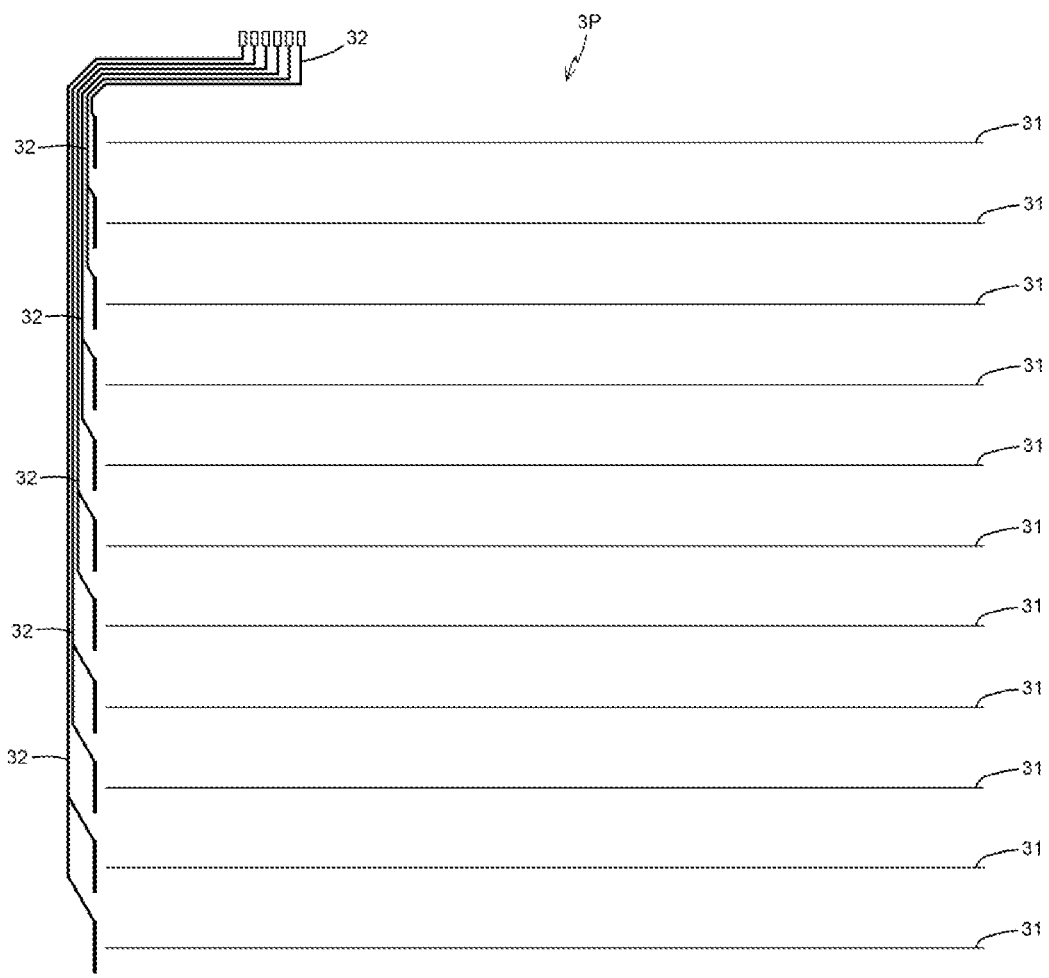
FIG. 13 is a plan view of the first auxiliary conductive trial pattern of the product of the first embodiment of the invention.
Figure 14:
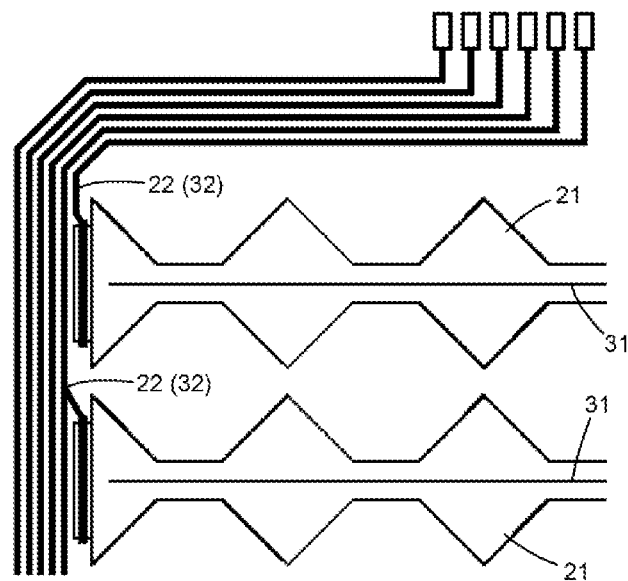
FIG. 14 is an enlarged view of portion F in FIG. 11.
Figure 15:
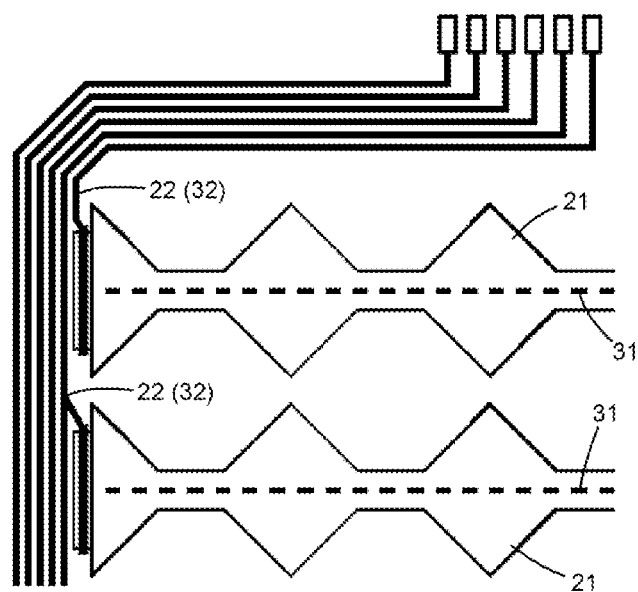
FIG. 15 is a plan view of another tiny conductive trial pattern of the product of the first embodiment of the invention.

As shown in FIGS. 11 and 13, the first auxiliary conductive layer 3 is electrically attached on the first touch conductive layer 2 and has a first auxiliary conductive trail pattern 3P formed in an area range defined by the first touch conductive trail pattern 2P. The first auxiliary conductive trail pattern 3P includes first micro auxiliary conductive units 31 and first auxiliary signal wires 32. The first micro auxiliary conductive units 31 are overlappingly disposed in at least part of the first touch sensing electrodes 21. The first auxiliary signal wires 32 are overlappingly formed in at least part of the first signal wires 22. The first micro auxiliary conductive unit 31 is a tiny conductive trail pattern formed by one or more of a nanometer-sized point, linear or planar graphic element. FIGS. 14-17 depict several exemplary embodiments of the tiny conductive trail pattern. To avoid obstructing the transmittance of the first touch sensing electrodes 21, the first micro auxiliary conductive units 31 are evenly distributed on surfaces of the first touch sensing electrodes 21, and a shading rate of the first micro auxiliary conductive units 31 is below 1%, more preferably, between 0.05%~0.2%. In this embodiment, the first micro auxiliary conductive unit 31 is one or more metal wires, and a width of the metal wire is less than 8 μm, preferably, less than 5 μm. Also, the first micro auxiliary conductive unit 31 does not connect with the first auxiliary signal wire 32.

Figure 18:
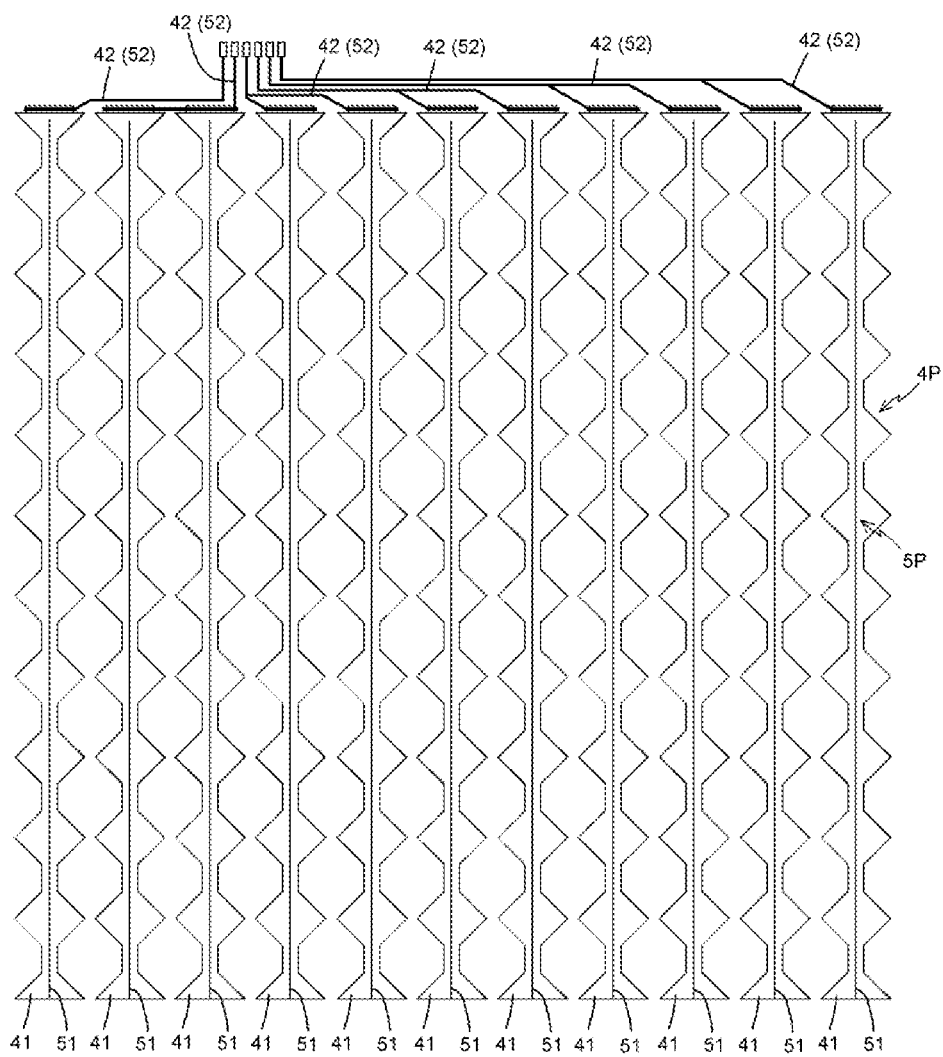
FIG. 18 is a plan view of the Y-axis touch sensing trail on the second side of the product of the substrate of the first embodiment of the invention.

Please refer to FIG. 18. The second touch conductive layer 4 is disposed on the second side 1B of the substrate 1 and has a second touch conductive trail pattern 4P with second touch sensing electrodes 41 and second signal wires 42. The second touch sensing electrodes 41 are diamonds arranged in the operative touch area and along a second direction (i.e. Y-axis direction) and connected in series. The first direction is orthogonal to the second direction. At least one end of each of the second touch sensing electrodes 41 connects with one of the second signal wires 42. The second signal wires 42 are arranged in the inoperative touch area.

The second auxiliary conductive layer 5 is electrically attached on the second touch conductive layer 4 and has a second auxiliary conductive trail pattern 5P formed in an area range defined by the second touch conductive trail pattern 4P. The second auxiliary conductive trail pattern 5P includes second micro auxiliary conductive units 51 and second auxiliary signal wires 52. The second micro auxiliary conductive units 51 are overlappingly formed in at least part of the second touch sensing electrodes 41. The second auxiliary signal wires 52 are overlappingly formed in at least part of the second signal wires 42. The second micro auxiliary conductive unit 51 is a tiny conductive trail pattern with the same arrangement as the tiny conductive trail pattern of the first micro auxiliary conductive unit 31 (as shown in FIGS. 14-17). To avoid obstructing the transmittance of the second touch sensing electrodes 41, the second micro auxiliary conductive units 51 are evenly distributed on surfaces of the second touch sensing electrodes 41, and a shading rate of the second micro auxiliary conductive units 51 is below 1%, more preferably, between 0.05%~0.2%. In this embodiment, as shown in FIG. 18, the second micro auxiliary conductive unit 51 is one or more metal wires, and a width of the metal wire is less than 8 μm, preferably, less than 5 μm. Also, the second micro auxiliary conductive units 51 does not connect with the second auxiliary signal wire 52.

The first touch conductive trail pattern 2P, the first auxiliary conductive trail pattern 3P, the second touch conductive trail pattern 4P and the second auxiliary conductive trail pattern 5P jointly constitute a capacitive touch sensor. The first auxiliary conductive trail pattern 3P is used for reducing a sheet resistance of the first touch conductive trail pattern 2P, and the second auxiliary conductive trail pattern 5P is used for reducing a sheet resistance of the second touch conductive trail pattern 4P.

The Second Embodiment

The second embodiment of the manufacturing method of the invention is depicted in FIGS. 19-27, and its steps are described below.

Figure 19:
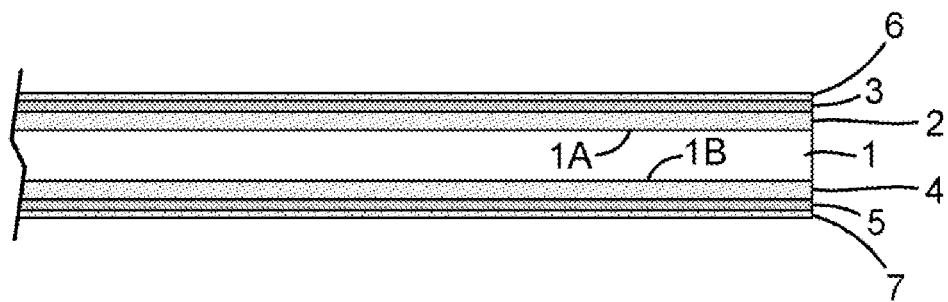
FIG. 19 is a cross-section view showing forming two conductive layers and a photoresist layer on each side of a substrate of the second embodiment of the invention.

Please refer to FIG. 19. First, prepare a dielectric substrate 1 with high transmittance. A first touch conductive layer 2 and a first auxiliary conductive layer 3 are superposed on a first side 1A of the dielectric substrate 1 in order. A second touch conductive layer 4 and a second auxiliary conductive layer 5 on a second side 1B of the dielectric substrate 1 in order. The first side 1A and the second side 1B are two opposite sides of the dielectric substrate 1.

The substrate 1 is made of glass, polycarbonate (PC), polyester (PET), polymethyl methacrylate (PMMA), or cycloolefin copolymer (COC), but not limited to these, any other flexible, rigid or soft transparent materials are also available. Both the first touch conductive layer 2 and the second touch conductive layer 4 are two transparent conductive films made of an identical material, which may be, but not limited to, a metal oxide such as indium tin oxide, indium zinc oxide, zinc aluminum oxide, tin antimony oxide or polyethylene dioxythiophenethe or graphene. Preferably, a sheet resistance of each of the first touch conductive layer 2 and the second touch conductive layer 4 is between 80 and 150 ohm/sq. Both the first auxiliary conductive layer 3 and the second auxiliary conductive layer 5 are two opaque conductive films made of an identical material, which may be, but not limited to, gold, silver, copper, aluminum, molybdenum, nickel or an alloy thereof. Preferably, sheet resistance of each of the first auxiliary conductive layer and the second auxiliary conductive layer is between 0.05 and 0.2 ohm/sq. As abovementioned, the first auxiliary conductive layer 3 is less than the first touch conductive layer 2 in sheet resistance, and the first auxiliary conductive layer 3 is electrically superposed on the first touch conductive layer 2. Identically, the second auxiliary conductive layer 5 is less than the second touch conductive layer 4 in sheet resistance, and the second auxiliary conductive layer 5 is electrically superposed on the second touch conductive layer 4. In this embodiment, each of the first touch conductive layer 2 and the second touch conductive layer 4 adopts an indium tin oxide (ITO) film which has been widely applied in touch panels, and each of the first auxiliary conductive layer 3 and the second auxiliary conductive layer 5 adopts a copper (Cu) film which possesses low impedance (great conductivity) and cheap price.

Figure 20:
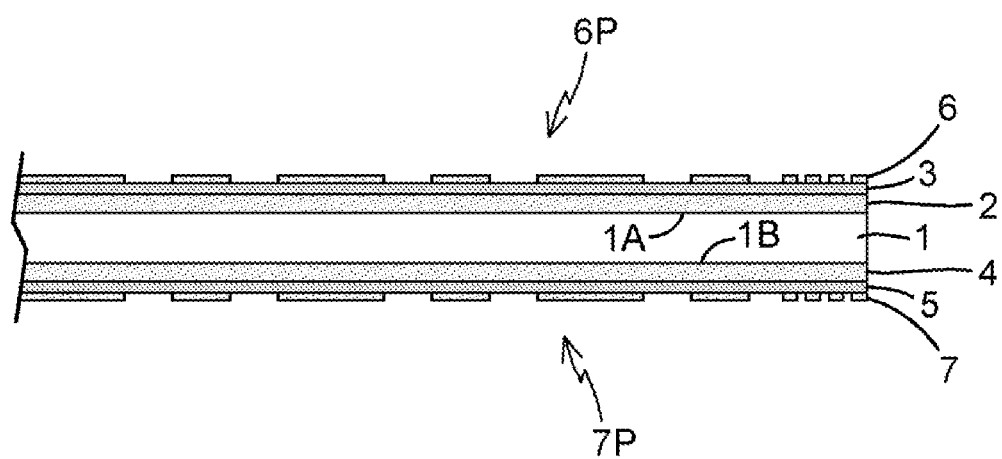
FIG. 20 is a cross-section view of the substrate after performing the first and second lithography processes of the second embodiment of the invention.

As shown in FIGS. 19 and 20, perform a first lithography process to the first side 1A of the substrate 1. The means for implementing the second lithography process is identical to the abovementioned first lithography process, so the details thereof will not be repeated here. A first photoresist trail pattern 6P can be developed to be formed on the first photoresist layer 6 by the first lithography process. In addition, a second lithography process is performed on the second side 1B of the substrate 1. The means for implementing the second lithography process is identical to the first lithography process of the first embodiment, so the details thereof will not be repeated here. As a result, a second photoresist trail pattern 7P can be developed to be formed on the second photoresist layer 7 on the second side 1B.

Figure 21:
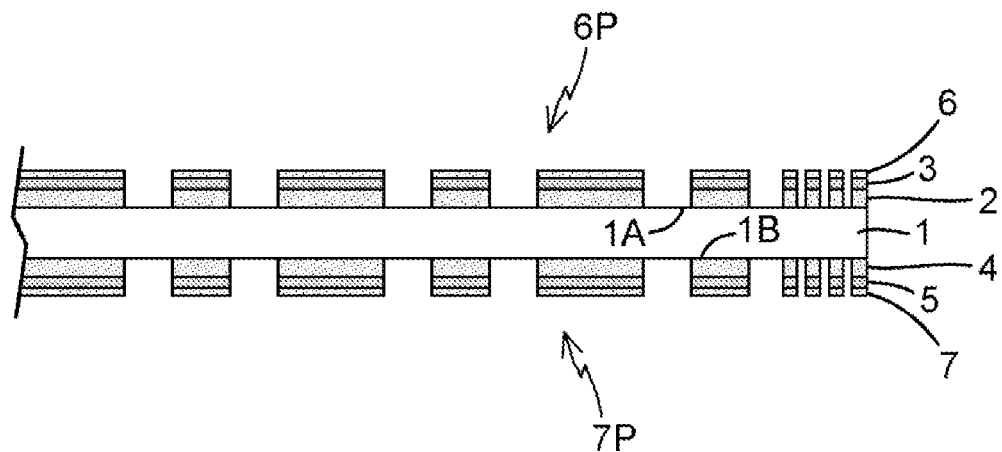
FIG. 21 is a cross-section view of the substrate after performing the first etching process of the second embodiment of the invention.

Please refer to FIG. 21. Next, simultaneously perform a first etching process to the first and second sides 1A, 1B of the substrate 1. Etch the various conductive layers on the substrate 1 by using a first etchant to remove portions of material, which are not protected by both the first photoresist layer 6 and the second photoresist layer 7. The first etchant is a complex etchant which can etch both the ITO material of both the first touch conductive layer 2 and the second touch conductive layer 4 and the copper material of both the first auxiliary conductive layer 3 and the second auxiliary conductive layer 5. In this embodiment, the first etchant at least contains iron nitrate $Fe(NO_3)_3$ and hydrochloric acid (HCl). The means for implementing the first etching process is identical to the first etching process of the first embodiment, so the details thereof will not be repeated here.

Figure 22:
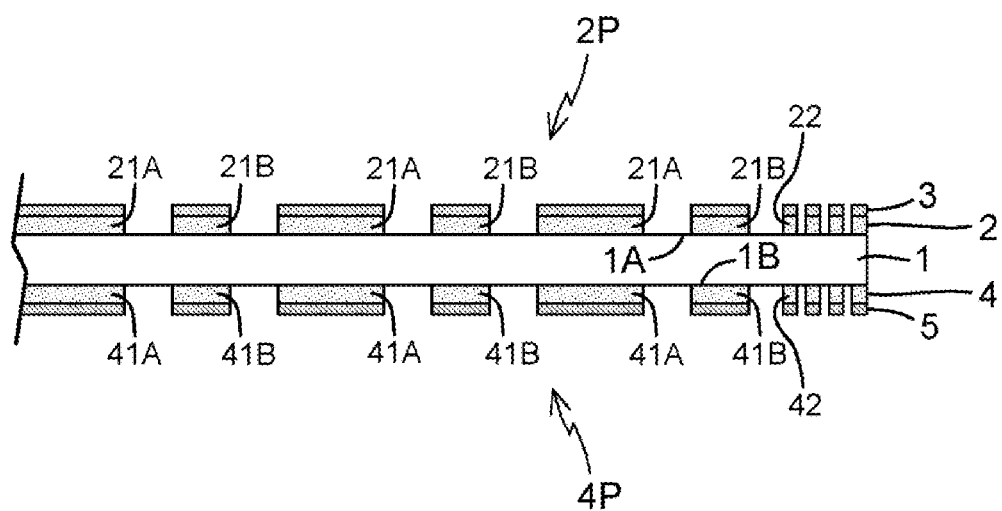
FIG. 22 is a cross-section view of the substrate after performing the first stripping process of the second embodiment of the invention.

Next, perform a first stripping process to remove the first and second photoresist layers 6, 7 on the substrate 1. The means for implementing the first stripping process is identical to the first stripping process of the first embodiment, so the details thereof will not be repeated here. As shown in FIG. 22, when the first stripping process has been finished, a first touch conductive trail pattern 2P corresponding to the first photoresist trail pattern 6P is formed by etching both the first touch conductive layer 2 and the first auxiliary conductive layer 3 on the first side 1A. The first touch conductive trail pattern 2P at least includes a pattern portion of first touch sensing electrodes 21A, a pattern portion of second touch sensing electrodes 21B and a pattern portion of first signal wires 22. Both the first touch sensing electrodes 21 and the second touch sensing electrodes 21B are parallelly arranged along a first direction (i.e. X-axis direction) at intervals and connected in series, and at least one end of each of the first and second touch sensing electrodes 21A, 21B electrically connects with one of the first signal wires 22. In addition, a second touch conductive trail pattern 4P corresponding to the second photoresist trail pattern 7P is formed by etching both the second touch conductive layer 4 and the second auxiliary conductive layer 5 on the second side 1B. The second touch conductive trail pattern 4P at least includes a pattern portion of third touch sensing electrodes 41A, a pattern portion of fourth touch sensing electrodes 41B and a pattern portion of a second signal wire 42. Both the third touch sensing electrodes 41A and the fourth touch sensing electrodes 41B are parallelly arranged along a second direction (i.e. Y-axis direction) at intervals and connected in series, and at least one end of each of the third and fourth touch sensing electrodes 41A, 41B electrically connects with one of the second signal wires 42.

Figure 23:
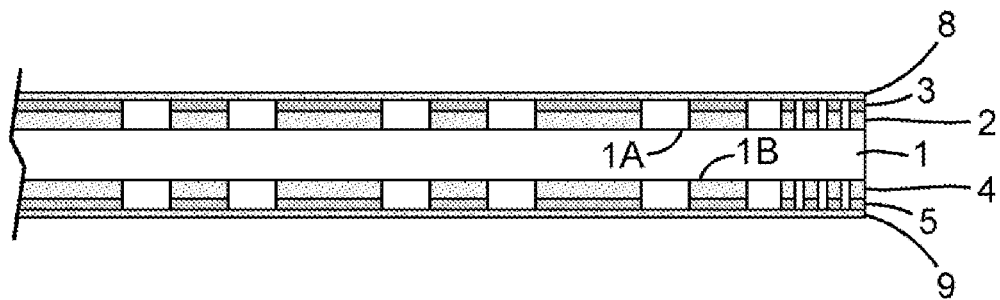
FIG. 23 is a cross-section view of the substrate after forming a photoresist layer on each side of the substrate of the second embodiment of the invention.
Figure 24:
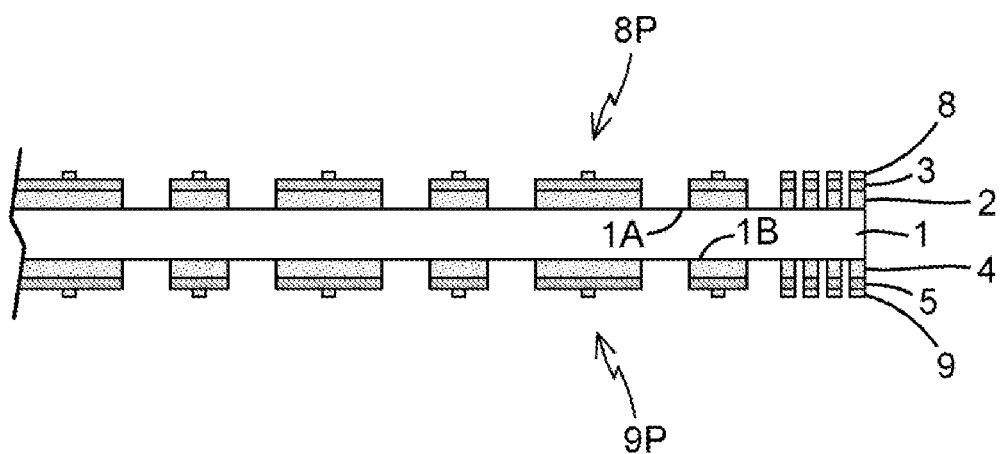
FIG. 24 is a cross-section view of the substrate after performing the third and fourth lithography processes of the second embodiment of the invention.

Please refer to FIGS. 23-24. Next, a third lithography process is performed on the first side 1A of the substrate 1. The means for implementing the third lithography process is identical to the first lithography process of the first embodiment, so the details thereof will not be repeated here. As a result, a third photoresist trail pattern 8P can be developed to be formed on the third photoresist layer 8 on the first side 1A. In addition, a fourth lithography process is performed on the second side 1B of the substrate 1. The means for implementing the fourth lithography process is identical to the first lithography process of the first embodiment, so the details thereof will not be repeated here. As a result, a fourth photoresist trail pattern 9P can be developed to be formed on the fourth photoresist layer 9 on the second side 1B.

Figure 25:
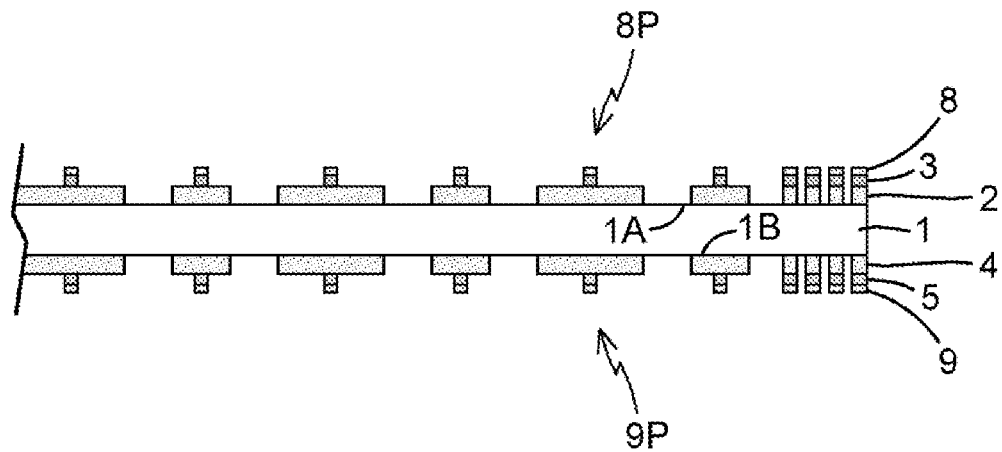
FIG. 25 is a cross-section view of the substrate after performing the second etching process of the second embodiment of the invention.

Please refer to FIG. 25. Next, simultaneously perform a second etching process to the first and second sides 1A, 1B of the substrate 1. Etch the first and the second auxiliary conductive layers 3, 5 on the substrate 1 by using a second etchant to remove portions of material, which are not protected by both the third photoresist layer 8 and the fourth photoresist layer 9. The second etchant does not etch the ITO material of both the first touch conductive layer 2 and the second touch conductive layer 4. In this embodiment, the second etchant at least contains iron nitrate $Fe(NO_3)_3$. The means for implementing the second etching process is identical to the first etching process of the first embodiment, so the details thereof will not be repeated here.

Finally, perform a second stripping process to remove the third and fourth photoresist layers 8, 9 on the substrate 1. The means for implementing the second stripping process is identical to the first stripping process of the first embodiment, so the details thereof will not be repeated here.

Figure 26:
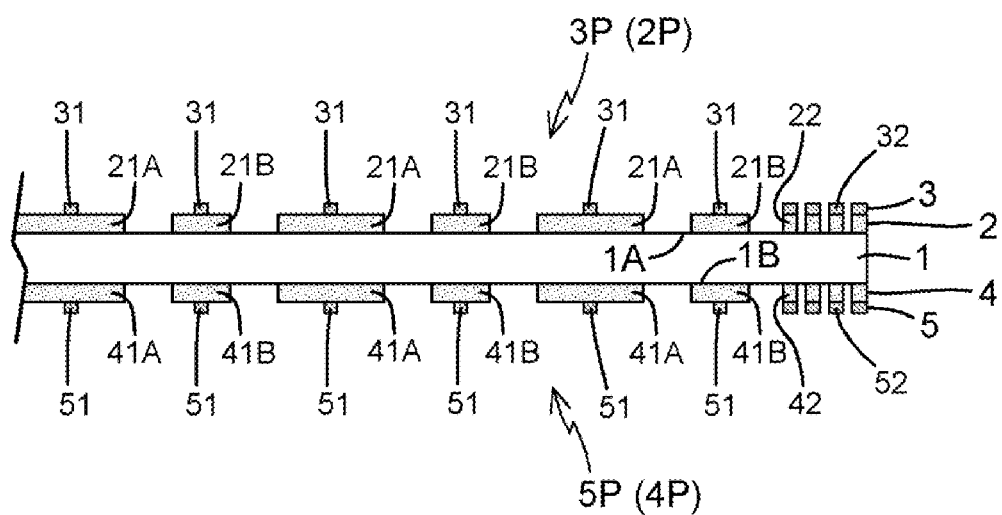
FIG. 26 is a cross-section view of the product of the substrate of the second embodiment of the invention.
Figure 27:
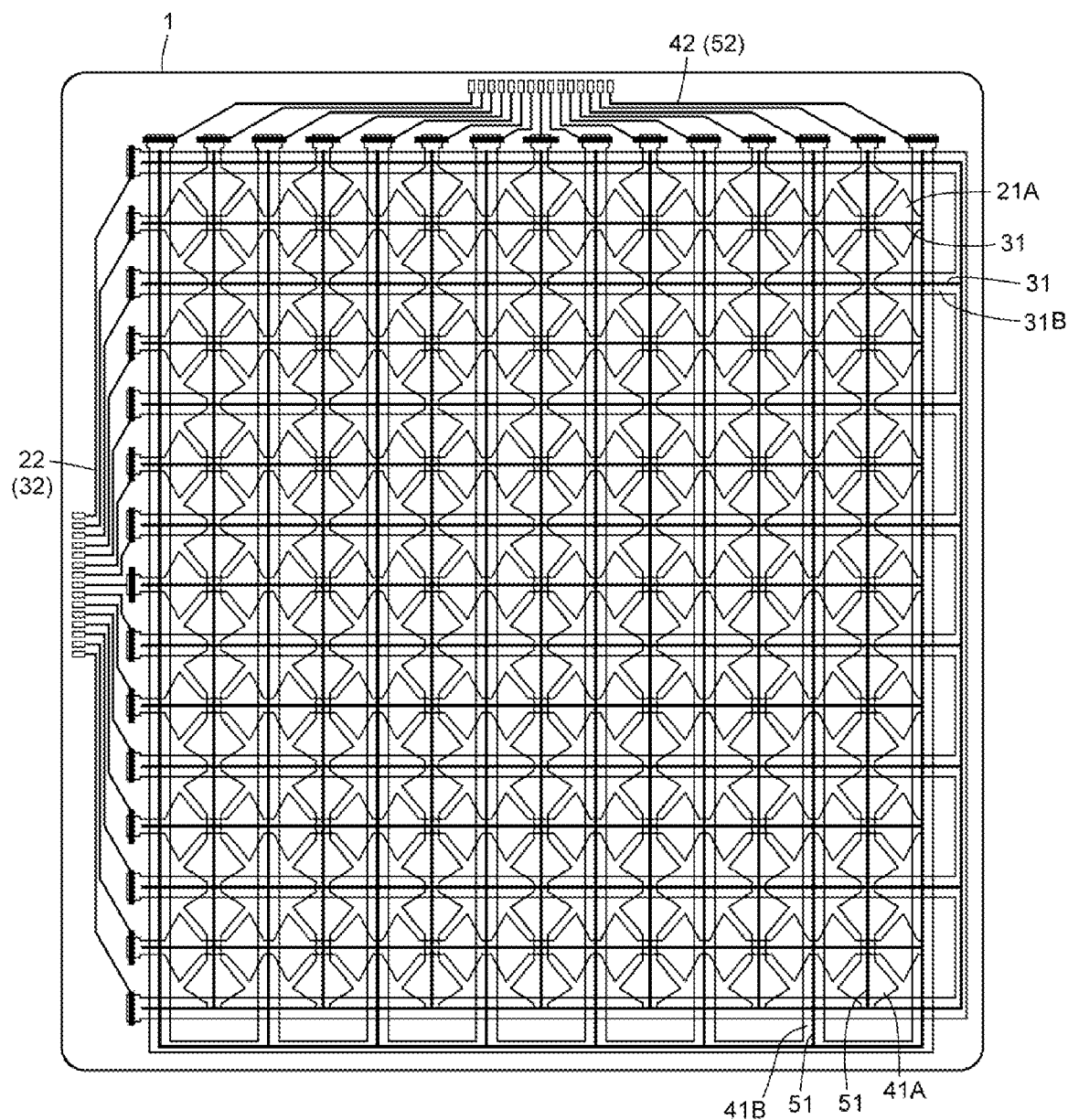
FIG. 27 is a plan view of the product of the substrate of the second embodiment of the invention.

As shown in FIGS. 26 and 27, when the second stripping process has been finished, a first auxiliary conductive trail pattern 3P corresponding to the third photoresist trail pattern 8P is formed by etching the first auxiliary conductive layer 3 on the first side 1A. And the first touch conductive trail pattern 2P formed by the first etching process is still kept on the first touch conductive layer 2. The first auxiliary conductive trail pattern 3P at least includes a pattern portion of first micro auxiliary conductive units 31 and a pattern portion of first auxiliary signal wires 32. Particularly, the first micro auxiliary conductive units 31 are arranged in an area range of both the first touch sensing electrodes 21A and the second touch sensing electrodes 21B, and a shading rate of the first micro auxiliary conductive units 21 A and the second touch sensing electrodes 21B is below 1%. At least part of the first auxiliary signal wire 32 is overlappingly formed in an area range of the first signal wires 22.

In addition, a second auxiliary conductive trail pattern 5P corresponding to the fourth photoresist trail pattern 9P is formed by etching the second auxiliary conductive layer 5 on the second side 1B. And the second touch conductive trail pattern 4P formed by the first etching process is still kept on the second touch conductive layer 4. The second auxiliary conductive trail pattern 5P at least includes a pattern portion of second micro auxiliary conductive units 51 and a pattern portion of second auxiliary signal wires 52. Particularly, the second micro auxiliary conductive units 51 are arranged in an area range of both the third touch sensing electrodes 41A and the fourth touch sensing electrode 41B, and a shading rate of the second micro auxiliary conductive unit 51 is below 1%. At least part of the second auxiliary signal wires 52 is overlappingly formed in an area range of the second signal wires 42.

In this embodiment, the first touch conductive trail pattern 2P, the first auxiliary conductive trail pattern 3P, the second touch conductive trail pattern 4P and the second auxiliary conductive trail pattern 5P jointly constitute two independent touch sensors. Both the first touch sensing electrodes 21A and the first micro auxiliary conductive units 31 jointly constitute a first directional (X-axis direction) capacitive touch sensing electrodes. Both the third touch sensing electrodes 41A and the second micro auxiliary conductive units 51 jointly constitute a second directional (Y-axis direction) capacitive touch sensing electrodes. Both the first directional capacitive touch sensing electrodes and the second directional capacitive touch sensing electrodes jointly constitute a capacitive touch sensor. Both the second touch sensing electrodes 21B and the first micro auxiliary conductive units 31 jointly constitute a first directional (X-axis direction) electromagnetic touch sensing electrodes. Both the fourth touch sensing electrodes 41B and the second micro auxiliary conductive units 51 jointly constitute a second directional (Y-axis direction) electromagnetic touch sensing electrodes. Both the first directional electromagnetic touch sensing electrodes and the second directional electromagnetic touch sensing electrodes jointly constitute an electromagnetic touch sensor.

The invention can reduce sheet resistance by means of disposing auxiliary conductive trail patterns 3P, 5P on the touch conductive trail patterns 2P, 4P. In a visible area of the touch sensor, the micro auxiliary conductive units 31, 51 disposed on the touch sensing electrodes 21A, 21B, 41A and 41B possess a very low shading rate (below 1%), so the influence upon the visibility is minimal or even negligible.

FIGS. 26-29 show a touch sensor made by the second embodiment of the manufacturing method of the invention. Its primary features are two independent touch sensors in a single touch sensor structure, micro auxiliary conductive units with high conductivity on touch sensing electrodes and auxiliary conductive wires with high conductivity electrically connected with signal wires. Thereby, sheet resistance of the touch sensing electrodes and conductive wires can be reduced. As a result, the touch sensor has required impedance without decreasing optical properties.

The following embodiment is a capacitive-and-electromagnetic touch sensor as an example. The touch sensor includes a substrate 1, a first touch conductive layer 2, a first auxiliary conductive layer 4, a second touch conductive layer 3 and a second auxiliary conductive layer 5. The substrate 1 is a plate with a dielectric property and high transmittance. Both the first touch conductive layer 2 and the second touch conductive layer 4 are two transparent conductive films made of an identical material such as ITO. A sheet resistance of each of the first touch conductive layer 2 and the second touch conductive layer 4 is between 80 and 150 ohm/sq. Both the first auxiliary conductive layer 3 and the second auxiliary conductive layer 5 are two opaque conductive films made of an identical material such as copper. A sheet resistance of each of the first auxiliary conductive layer and the second auxiliary conductive layer is between 0.05 and 0.2 ohm/sq.

The substrate 1 is defined with an operative touch area in a central portion of the substrate 1 and an inoperative touch area surrounding the operative touch area.

Figure 28:
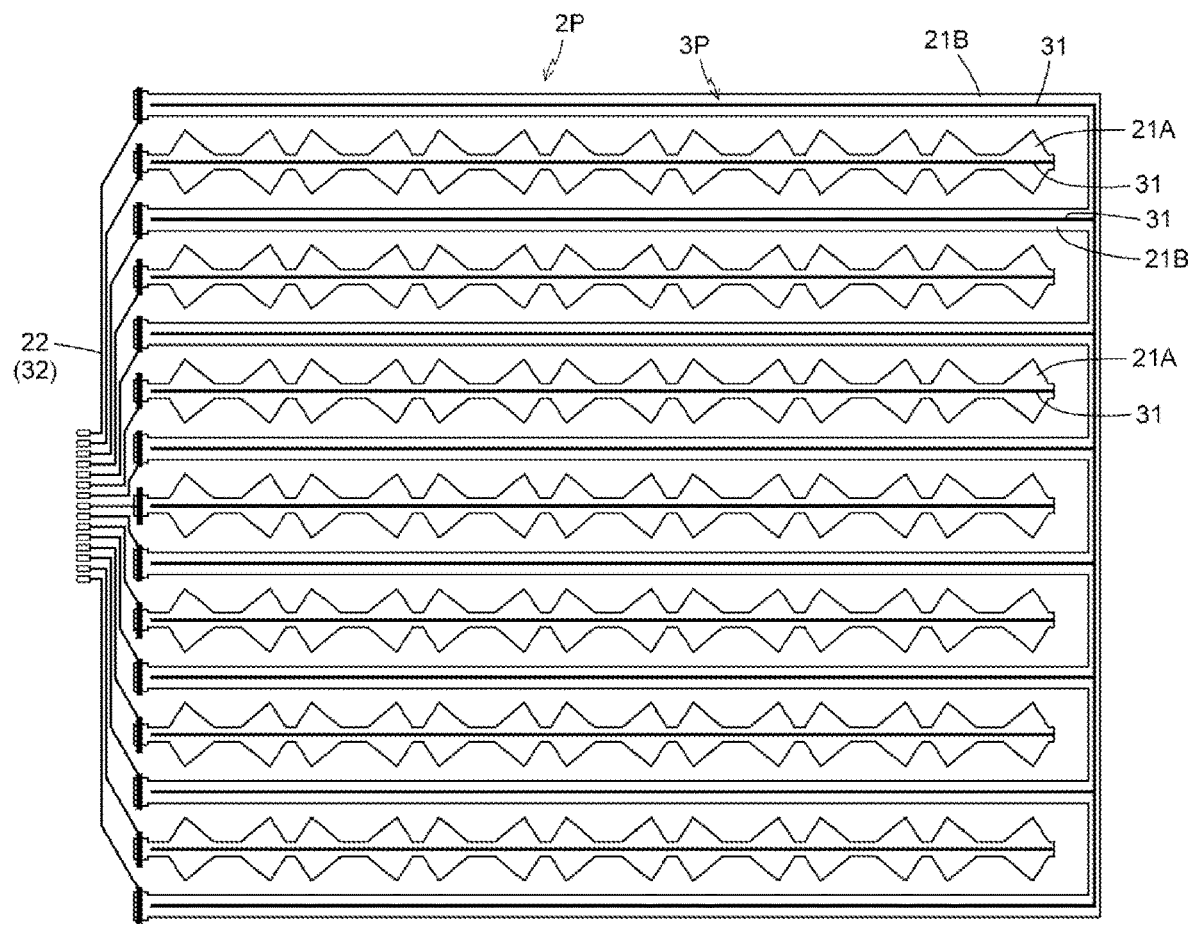
FIG. 28 is a plan view of the X-axis touch sensing trail on the first side of the product of the substrate of the second embodiment of the invention.

As shown in FIGS. 26 and 28, the first touch conductive layer 2 is disposed on a first side 1A of the substrate 1 and has the first touch conductive trail pattern 2P with first touch sensing electrodes 21A, second touch sensing electrodes 21B and first signal wires 22. Both the first touch sensing electrodes 21A and the second touch sensing electrodes 21B are located in the operative touch area. The first touch sensing electrodes 21A are diamonds connected in series and the second touch sensing electrodes 21B are straight lines, and they both are parallelly arranged along a first direction (i.e. X-axis direction) at intervals. At least one end of each of the first touch sensing electrodes 21A and the second touch sensing electrodes 21B connects with one of the first signal wires 22. The first signal wires 22 are arranged in the inoperative touch area.

The first auxiliary conductive layer 3 is electrically attached on the first touch conductive layer 2 and has a first auxiliary conductive trail pattern 3P formed in an area range defined by the first touch conductive trail pattern 2P. The first auxiliary conductive trail pattern 3P includes first micro auxiliary conductive units 31 and first auxiliary signal wires 32. The first micro auxiliary conductive units 31 are overlappingly disposed in at least part of both the first touch sensing electrodes 21A and the second touch sensing electrodes 21B.

The first auxiliary signal wires 32 are overlappingly formed in at least part of the first signal wires 22. The first micro auxiliary conductive unit 31 is a tiny conductive trail pattern formed by one or more of a nanometer-sized point, linear or planar graphic element. To avoid obstructing the transmittance of the first touch sensing electrodes 21, the first micro auxiliary conductive units 31 are evenly distributed on surfaces of both the first touch sensing electrodes 21A and the second touch sensing electrodes 21B, and a shading rate thereof is below 1%, more preferably, between 0.05%~0.2%. In this embodiment, the first micro auxiliary conductive unit 31 is one or more metal wires, and a width of the metal wire is less than 8 μm, preferably, less than 5 μm. Also, the first micro auxiliary conductive unit 31 does not connect with the first auxiliary signal wire 32.

Figure 29:
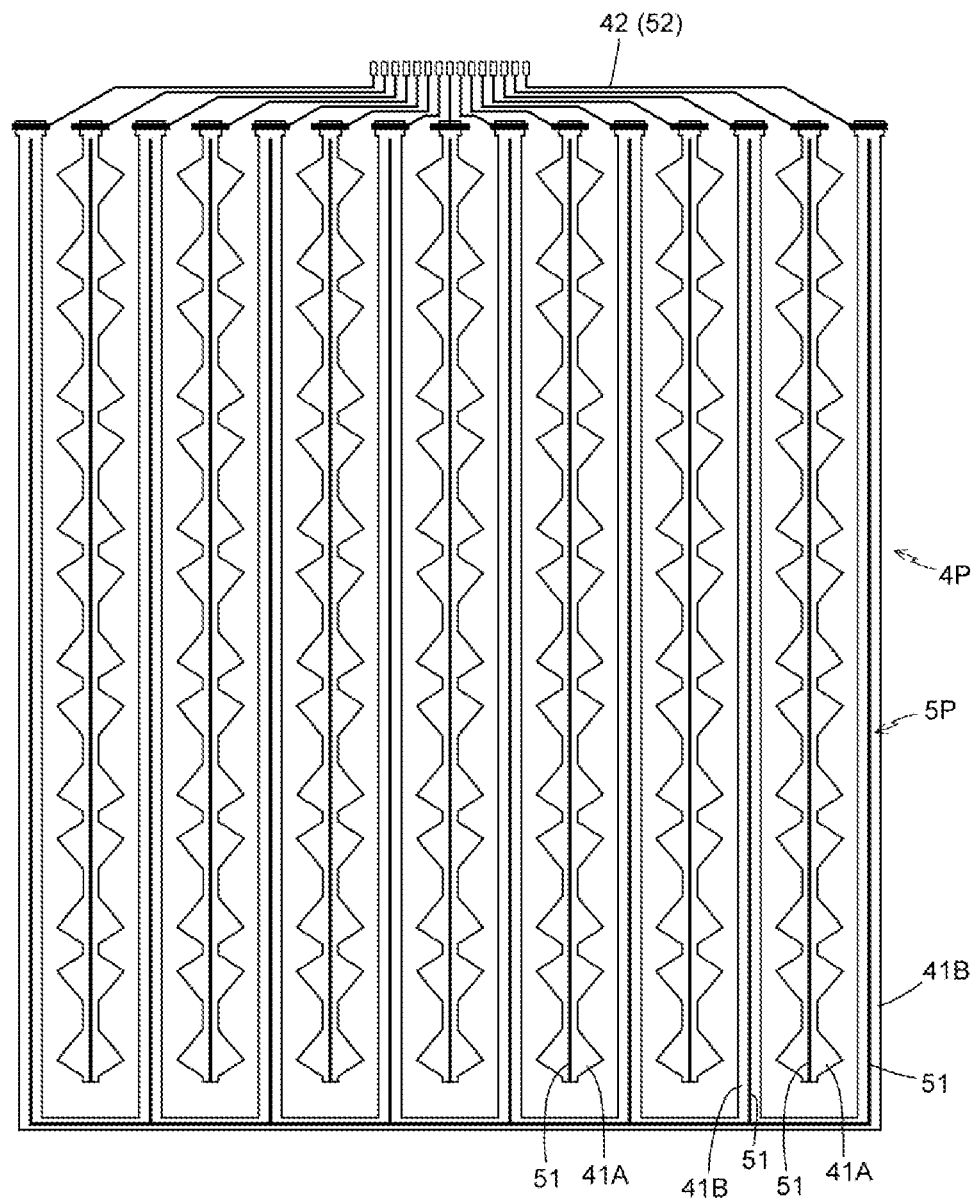
FIG. 29 is a plan view of the Y-axis touch sensing trail on the second side of the product of the substrate of the second embodiment of the invention.

Please refer to FIGS. 26 and 29. The second touch conductive layer 4 is disposed on the second side 1B of the substrate 1 and has a second touch conductive trail pattern 4P with third touch sensing electrodes 41A, fourth touch sensing electrodes 41B and second signal wires 42. The second touch sensing electrodes 41 are located in the operative touch area. The third touch sensing electrodes 41A are diamonds connected in series, the fourth touch sensing electrodes 41B are straight lines, and they both are arranged parallelly along a second direction (i.e. Y-axis direction). At least one end of each of the first and second touch sensing electrodes 41A, 41B connects with one of the second signal wires 42. The second signal wires 42 are arranged in the inoperative touch area.

Figure 16:
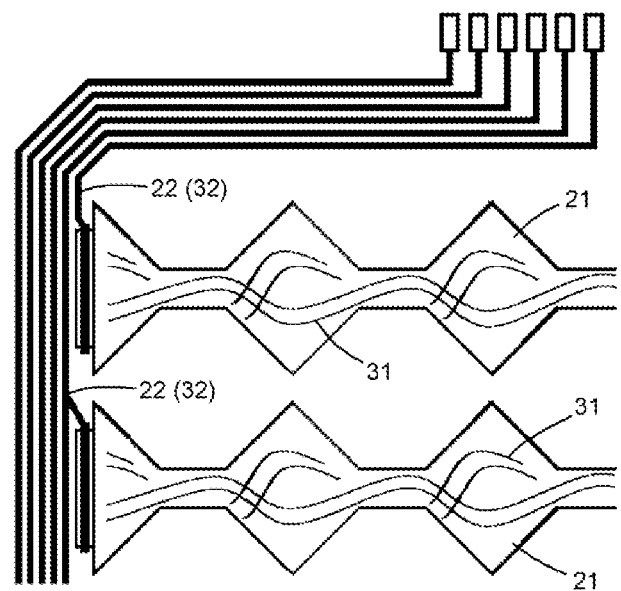
FIG. 16 is a plan view of still another tiny conductive trial pattern of the product of the first embodiment of the invention.
Figure 17:
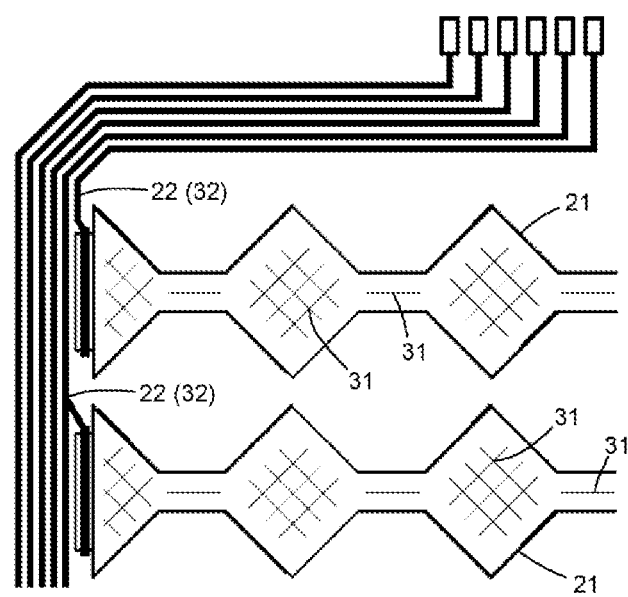
FIG. 17 is a plan view of yet another tiny conductive trial pattern of the product of the first embodiment of the invention.

The second auxiliary conductive layer 5 is electrically attached on the second touch conductive layer 4 and has a second auxiliary conductive trail pattern 5P formed in an area range defined by the second touch conductive trail pattern 4P. The second auxiliary conductive trail pattern 5P includes second micro auxiliary conductive units 51 and second auxiliary signal wires 52. The second micro auxiliary conductive units 51 are overlappingly formed in both the third touch sensing electrodes 41A and the fourth touch sensing electrodes 41B. The second auxiliary signal wires 52 are overlappingly formed in at least part of the second signal wires 42. The second micro auxiliary conductive unit 51 is a tiny conductive trail pattern with the same arrangement as the tiny conductive trail pattern of the first micro auxiliary conductive unit 31. To avoid obstructing the transmittance of the second touch sensing electrodes 41, the second micro auxiliary conductive units 51 are evenly distributed on surfaces of the second touch sensing electrodes 41, and a shading rate thereof is below 1%, more preferably, between 0.05%~0.2%. In this embodiment, as shown in FIG. 16, the second micro auxiliary conductive unit 51 is one or more metal wires, and a width of the metal wire is less than 8 μm, preferably, less than 5 μm. Also, the second micro auxiliary conductive units 51 does not connect with the second auxiliary signal wire 52.

The first touch conductive trail pattern 2P, the first auxiliary conductive trail pattern 3P, the second touch conductive trail pattern 4P and the second auxiliary conductive trail pattern 5P jointly constitute two independent touch sensors. In detail, both the first touch sensing electrodes 21A and the first micro auxiliary conductive units 31 jointly constitute a first directional (X-axis direction) capacitive touch sensing electrodes, and both the third touch sensing electrodes 41A and the second micro auxiliary conductive units 51 jointly constitute a second directional (Y-axis direction) capacitive touch sensing electrodes. Both the first directional capacitive touch sensing electrodes and the second directional capacitive touch sensing electrodes jointly constitute a capacitive touch sensor. Both the second touch sensing electrodes 21B and the first micro auxiliary conductive units 31 jointly constitute a first directional (X-axis direction) electromagnetic touch sensing electrodes. Both the fourth touch sensing electrodes 41B and the second micro auxiliary conductive units 51 jointly constitute a second directional (Y-axis direction) electromagnetic touch sensing electrodes. Both the first directional electromagnetic touch sensing electrodes and the second directional electromagnetic touch sensing electrodes jointly constitute an electromagnetic touch sensor. The first auxiliary conductive trail pattern 3P is used for reducing a sheet resistance of the first touch conductive trail pattern 2P, and the second auxiliary conductive trail pattern 5P is used for reducing a sheet resistance of the second touch conductive trail pattern 4P.

It will be appreciated by persons skilled in the art that the above embodiments have been described by way of example only and not in any limitative sense, and that various alterations and modifications are possible without departure from the scope of the invention as defined by the appended claims.

What is claimed is:
1. A touch sensor comprising:
a substrate, having a dielectric property and transmittance, defined with an operative touch area in a central portion of the substrate and an inoperative touch area surrounding the operative touch area;
a first touch conductive layer, being a transparent conductive film, disposed on a first side of the substrate, having a first touch conductive trail pattern with first touch sensing electrodes and first signal wires, wherein the first touch sensing electrodes are arranged in the operative touch area and along a first direction in series, at least one end of each of the first touch sensing electrodes connects with one of the first signal wires, and the first signal wires are arranged in the inoperative touch area;

a first auxiliary conductive layer, being an opaque conductive film, electrically attached on the first touch conductive layer, having a lower sheet resistance than the first touch conductive layer, having a first auxiliary conductive trail pattern formed in an area range defined by the first touch conductive trail pattern, wherein the first auxiliary conductive trail pattern comprises first micro auxiliary conductive units and first auxiliary signal wires, the first micro auxiliary conductive units are overlappingly disposed in an area range of the first touch sensing electrodes, and the first auxiliary signal wires are overlappingly formed in at least part of an area range of the first signal wires;

a second touch conductive layer, being a transparent conductive film, disposed on a second side of the substrate, having a second touch conductive trail pattern with second touch sensing electrodes and second signal wires, wherein the second touch sensing electrodes are arranged in the operative touch area and along a second direction in series, at least one end of each of the second touch sensing electrodes connects with one of the second signal wires, the second signal wires are arranged in the inoperative touch area, and the first direction is orthogonal to the second direction; and a second auxiliary conductive layer, being an opaque conductive film, electrically attached on the second touch conductive layer, having a lower sheet resistance than the second touch conductive layer, having a second auxiliary conductive trail pattern formed in an area range defined by the second touch conductive trail pattern, wherein the second auxiliary conductive trail pattern comprises second micro auxiliary conductive units and second auxiliary signal wires, the second micro auxiliary conductive units are overlappingly disposed in an area range of the second touch sensing electrodes, and the second auxiliary signal wires are overlappingly formed in at least part of an area range of the second signal wires, and the first touch conductive trail pattern, the first auxiliary conductive trail pattern, the second touch conductive trail pattern and the second auxiliary conductive trail pattern jointly constitute a touch sensor.

2. The touch sensor of claim 1, wherein a sheet resistance of each of the first touch conductive layer and the second touch conductive layer is between 80 and 150 ohm/sq, and a sheet resistance of each of the first auxiliary conductive layer and the second auxiliary conductive layer is between 0.05 and 0.2 ohm/sq.

3. The touch sensor of claim 1, wherein both the first touch conductive layer and the second touch conductive layer are formed by indium tin oxide, and both the first auxiliary conductive layer and the second auxiliary conductive layer are formed by copper.

4. The touch sensor of claim 1, wherein each of the first micro auxiliary conductive unit and the second micro auxiliary conductive unit is a tiny conductive trail pattern formed by one or more of a nanometer-sized point, linear or planar graphic element.

5. The touch sensor of claim 4, wherein the first micro auxiliary conductive units are evenly distributed on surfaces of the first touch sensing electrodes, a shading rate of the first micro auxiliary conductive units is below 1%, the second micro auxiliary conductive units are evenly distributed on surfaces of the second touch sensing electrodes, and a shading rate of the second micro auxiliary conductive units is below 1%.

6. The touch sensor of claim 5, wherein the shading rate is between 0.05% and 0.2%.

7. The touch sensor of claim 4, wherein each of the first micro auxiliary conductive unit and the second micro auxiliary conductive unit is one or more metal wires, and a width of the metal wire is less than 8 μm.

8. The touch sensor of claim 1, wherein the first micro auxiliary conductive unit does not connect with the first auxiliary signal wire, and the second micro auxiliary conductive unit does not connect with the second auxiliary signal wire.

* * * * *